United States Patent [19]
Pritchard

[11] Patent Number: 6,087,808
[45] Date of Patent: Jul. 11, 2000

[54] SYSTEM AND METHOD FOR ACCURATELY DETERMINING REMAINING BATTERY LIFE

[76] Inventor: Jeffrey A. Pritchard, 1206 Diablo Pl., Vista, Calif. 92083

[21] Appl. No.: 09/298,761

[22] Filed: Apr. 23, 1999

[51] Int. Cl.[7] .......................... H01M 10/44; H01M 10/46
[52] U.S. Cl. ............................................................ 320/132
[58] Field of Search ..................................... 320/124, 125, 320/132, 135, 136, DIG. 18, DIG. 21; 324/426, 430, 433; 340/635, 636; 429/90

[56] References Cited

U.S. PATENT DOCUMENTS

| | | | |
|---|---|---|---|
| 4,876,513 | 10/1989 | Brilmyer et al. | 324/427 |
| 5,352,968 | 10/1994 | Reni et al. | |
| 5,635,815 | 6/1997 | Whitchurch et al. | |
| 5,936,383 | 8/1999 | Ng et al. | |

*Primary Examiner*—Edward H. Tso
*Attorney, Agent, or Firm*—Philip R. Wadsworth; Charles D. Brown; Raymond B. Hom

[57] ABSTRACT

A system for providing an accurate indication of the remaining life of a battery. The system includes a first circuit that provides a control signal. A second circuit employs an internal resistance value of the battery and a battery voltage to provide the indication of remaining battery life in response to the control signal. In a specific embodiment, the second circuit includes a third circuit that measures the internal resistance of the battery in response to the control signal. The third circuit also includes a circuit for measuring an output current and an output voltage of the battery at varying battery loads. The circuit for measuring an output current includes an ammeter and a switching load. In a more specific embodiment, the switching load is implemented as a transmitter that is selectively activated via the control signal. A fourth circuit, included in the second circuit, provides the indication of remaining battery life in response to the internal resistance. The fourth circuit also includes a circuit for selecting a battery discharge curve in accordance with the internal resistance. Software running on the first circuit generates the estimate based on the discharge curve, which is subsequently displayed via a display.

13 Claims, 4 Drawing Sheets

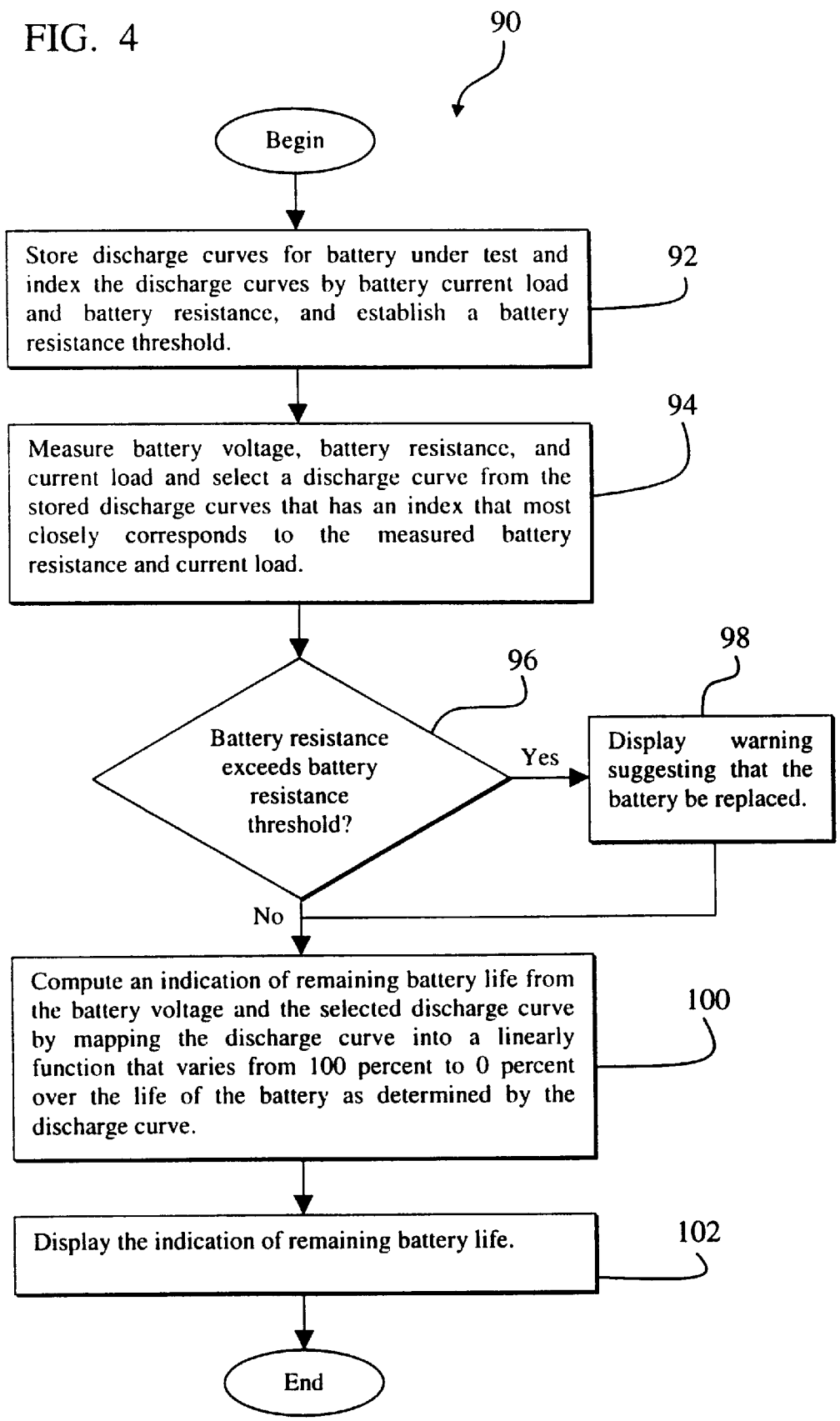

SYSTEM AND METHOD FOR ACCURATELY DETERMINING REMAINING BATTERY LIFE

BACKGROUND OF THE INVENTION

I. Field of Invention

This invention relates to batteries. Specifically, the present invention relates to systems and methods for indicating a charged state of a rechargeable battery and for indicating when the battery should be replaced.

II. Description of the Related Art

Batteries are designed to provide approximately constant voltages to a variety of applications ranging from electronic amplifiers and receivers in wireless phones to automobiles. Such applications often require accurate battery gauges or indicators to indicate remaining battery life. Accurate battery life indicators are particularly important in applications such as wireless phones, where rechargeable batteries are common, and knowledge of remaining battery life is desirable.

A battery often includes two metal electrodes immersed in an electrolyte having a depolarizing mix. Batteries are often named in accordance with the type of electrolyte employed such as nickel-cadmium, alkaline-manganese, lead storage, mercury, zinc-carbon, and lithium.

Typically, batteries are designed to approximate ideal voltage sources. However, unlike ideal voltage sources, which have zero internal resistance, batteries have non-zero internal resistance, which is often neglected in the design of electrical systems such as remaining battery life indicators. The internal resistance of a battery varies with battery age but remains relatively constant over short time periods, such as during charging and discharging. As a rechargeable battery ages over several charging cycles, its internal resistance increases as its chemistry, i.e., electrolyte and/or depolarizing mix, degrades. As a battery's chemistry degrades, its ability to hold a charge also degrades.

A battery's performance is often characterized by a discharge curve, which is a curve depicting battery voltage as a function of time given a predetermined discharge rate, i.e., battery current draw. The discharge curve often drops dramatically at a discharge curve knee.

Discharge curves vary with the internal resistance of the battery, the battery discharge rate, and temperature. This is particularly true for zinc-carbon batteries. As the discharge curve changes, so does the capacity and life of the battery. In addition, discharge curves vary in accordance with battery type. Current trends in re-chargeable battery technology are resulting in discharge curves with sharper knees, which may magnify errors associated with conventional battery life indicators.

As a battery ages, its internal resistance generally increases. Hence, battery voltage output, as depicted by the discharge curve, varies not only with temperature and discharge rate but also with battery age. A high discharge rate, a drop in temperature, or an extended storage period reduces battery capacity and life span and causes the discharge curve to drop-off sooner. Most batteries have a limited shelf life, which is the time required for the voltage of an unused battery to drop below a predetermined percentage of its original voltage.

To display remaining battery life, one approach measures the battery voltage and displays a value equivalent to the ratio of the measured voltage to the voltage of a new battery as an indication of remaining battery life. Unfortunately, such gauges are often deceptive and do not account for the knee in the voltage discharge curve or changes of the discharge curve with temperature, discharge rate, battery age, and so on. For example, when the state of the battery nears the knee in the discharge curve, the gauge may indicate that the battery is approximately fully charged, when in fact, it will soon require recharging.

An alternative approach involves accounting for an average shape of the discharge curve of a new battery and mapping voltage values from the average discharge curve into a set of values that varies linearly with time. In this way, when the battery voltage nears the knee in the discharge curve, the battery life indicator is more accurate and is less likely to drop off suddenly as the discharge curve reaches the knee. This approach, however, has significant limitations.

As the battery ages, the discharge curve changes from that of a new battery as the internal resistance of the battery changes. Over time, remaining battery life as indicated by simply measuring the battery voltage and accounting for an average discharge curve of a new battery, quickly becomes inaccurate. This approach also does not account for changes in a battery's discharge curve due to changes in the discharge rate or changes in temperature. Hence, when significant current is drawn from the battery, such as during a phone call via a wireless phone employing the battery, the battery indicator will display erroneous information. For example, many phones display significantly reduced battery life immediately after a call. Shortly thereafter, the battery life indicator rises as though the battery is recharging itself.

Hence, existing systems and methods for indicating remaining battery life typically do not account for changes in a battery's discharge curve as the battery ages and its internal resistance increases. As the battery ages, voltage dropped across the battery's internal resistance increases, changes the discharge curve, and adversely effects the accuracy of the battery indicator or gauge. In addition, as more current is drawn from the battery, more voltage drops across the internal resistance of the battery, which also changes the discharge curve. This introduces errors in battery gauges that are based primarily on battery voltage alone. As a battery ages, predetermined battery voltages used to estimate remaining battery life become less appropriate as they are chosen based on the discharge curve of a new battery.

Hence, a need exists in the art for a system and method for accurately displaying the remaining life of a rechargeable battery. There is a further need for a system that accounts for variations in the internal resistance of a battery with age and variations in a battery's discharge curve with discharge rate.

SUMMARY OF THE INVENTION

The need in the art is addressed by the system for providing an accurate indication of the remaining life of a battery of the present invention. In the illustrative embodiment, the inventive system is adapted for use with a wireless phone and includes a first circuit for providing a control signal. A second circuit employs an internal resistance value of the battery and a measured battery voltage to provide the indication of remaining battery life in response to the control signal.

In a specific embodiment, the second circuit includes a third circuit that measures the internal resistance of the battery in response to the control signal. The third circuit also includes a circuit for measuring an output current and an output voltage of the battery at varying battery loads. The circuit for measuring an output current includes an ammeter and a switching load.

In a more specific embodiment, the switching load is implemented as a transmitter that is selectively activated via the control signal. A fourth circuit provides the indication of remaining battery life in response to the internal resistance. The fourth circuit also includes a circuit for selecting a battery discharge curve in accordance with the internal resistance. Software running on the first circuit generates the estimate based on the discharge curve and the battery voltage, which is subsequently displayed via a display.

The novel design of the present invention is facilitated by the second circuit that measures or computes an internal resistance of the battery. As the internal resistance of the battery changes with age, temperature, and other variables, so do its discharge curves. By accounting for changes in the internal resistance of the battery over the life of the battery, more appropriate discharge curves are employed by the second circuit to provide more accurate indications of remaining battery life. Furthermore, the second circuit accommodates changes in the discharge curve of the battery with varying current loads, which essentially accounts for the internal resistance of the battery and further refines the selection of the appropriate discharge curve by the second circuit.

BRIEF DESCRIPTION OF THE DRAWINGS

FIG. 4 is a flow diagram of the method for determining remaining battery life as implemented via software running on the computer of the system of FIG. 2.

DESCRIPTION OF THE INVENTION

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

The following review of discharge curves for conventional batteries is intended to facilitate an understanding of the present invention.

Figure 1:
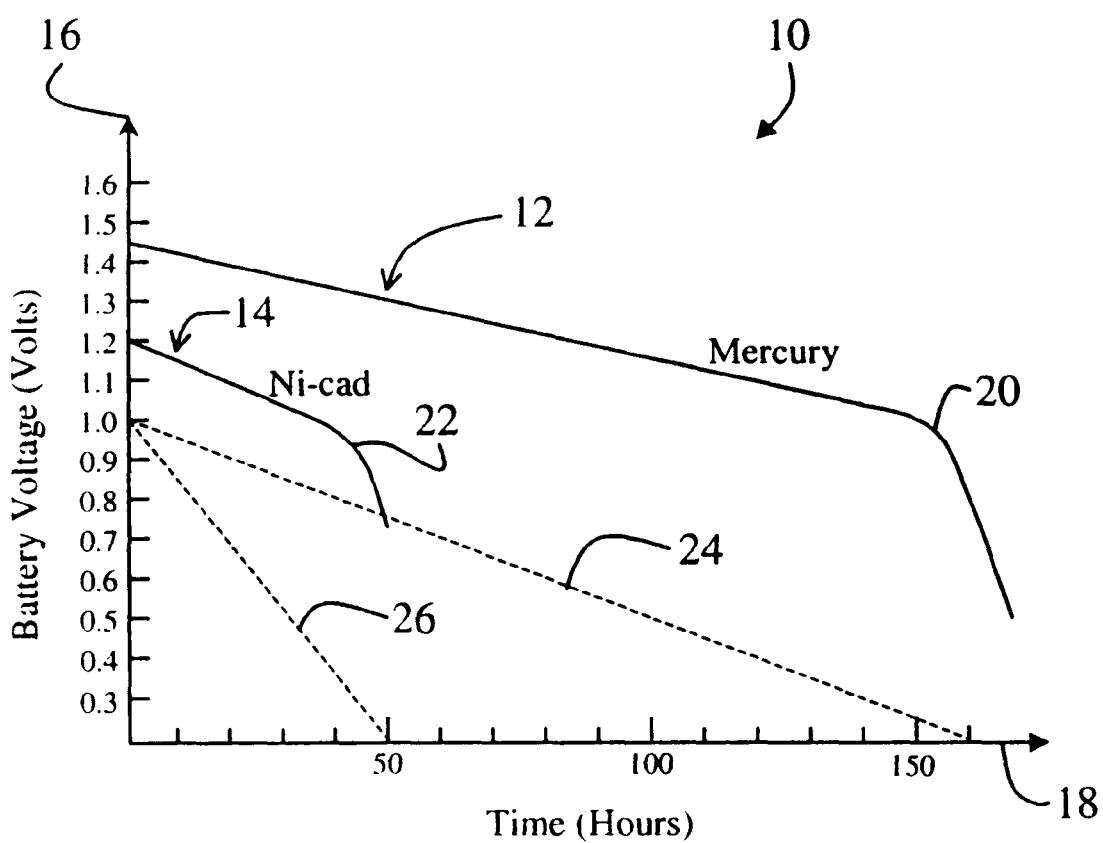
FIG. 1 is a graph showing average discharge curves for varying types of conventional D-size batteries with an initial current draw of 100 mA.

FIG. 1 is a graph 10 showing a discharge curve 12 for a conventional D-size mercury battery with an initial current draw of 100 mA and a discharge curve 14 for a conventional nickel-cadmium (Ni-cad) battery with an initial current draw of 100 mA. The graph 10 includes a vertical battery voltage axis 16 labeled in volts and a time axis 18 labeled in hours. The mercury discharge curve 12 descends relatively smoothly and gradually from approximately 1.45 volts to approximately 1.05 until about 150 hours, after which the discharge curve 12 drops off sharply at mercury discharge curve knee 20. Similarly, the nickel-cadmium discharge curve 14 descends relatively smoothly and gradually from approximately 1.20 volts to approximately 0.95 volts until about 45 hours, after which the discharge curve 14 drops off sharply at a Ni-cad discharge curve knee 22.

For the purposes of the present discussion, the term relative remaining battery life refers to the portion of remaining battery life relative to the battery life of a fully charged battery. Relative remaining battery life may be displayed as a percentage of remaining battery life.

Many conventional battery gauges (not shown) are designed to indicate relative remaining battery life by simply displaying battery voltage. As a result, such devices may display erroneous indications of remaining battery life when the discharge curves 12 and 14 near the knees 20 or 22, when a different amount of current (other than 100 mA) is drawn from the batteries so as to shift the discharge curves 12 and 14, when the battery ages over several charging cycles in the case of a re-chargeable battery, and when certain environmental factors, such as temperature, change significantly.

To account for the discharge curve knee, some battery gauge systems map, for example, the mercury discharge curve 12 into a first linear function 24 and the Ni-cad discharge curve 14 into a second linear function 26, respectively, that vary linearly over the expected life cycle of the battery. The linear functions 24 and 26 are displayed as indications of remaining battery life.

Unfortunately, such systems still do not account for varying current loads, the age of the battery, and other environmental factors such as temperature. As a battery ages or as temperature changes, the internal resistance of the battery also changes. The present invention employs this often unrecognized fact, as well as the fact that a battery's discharge curve changes with varying current loads, to provide an accurate indication of relative remaining battery life.

Figure 2:
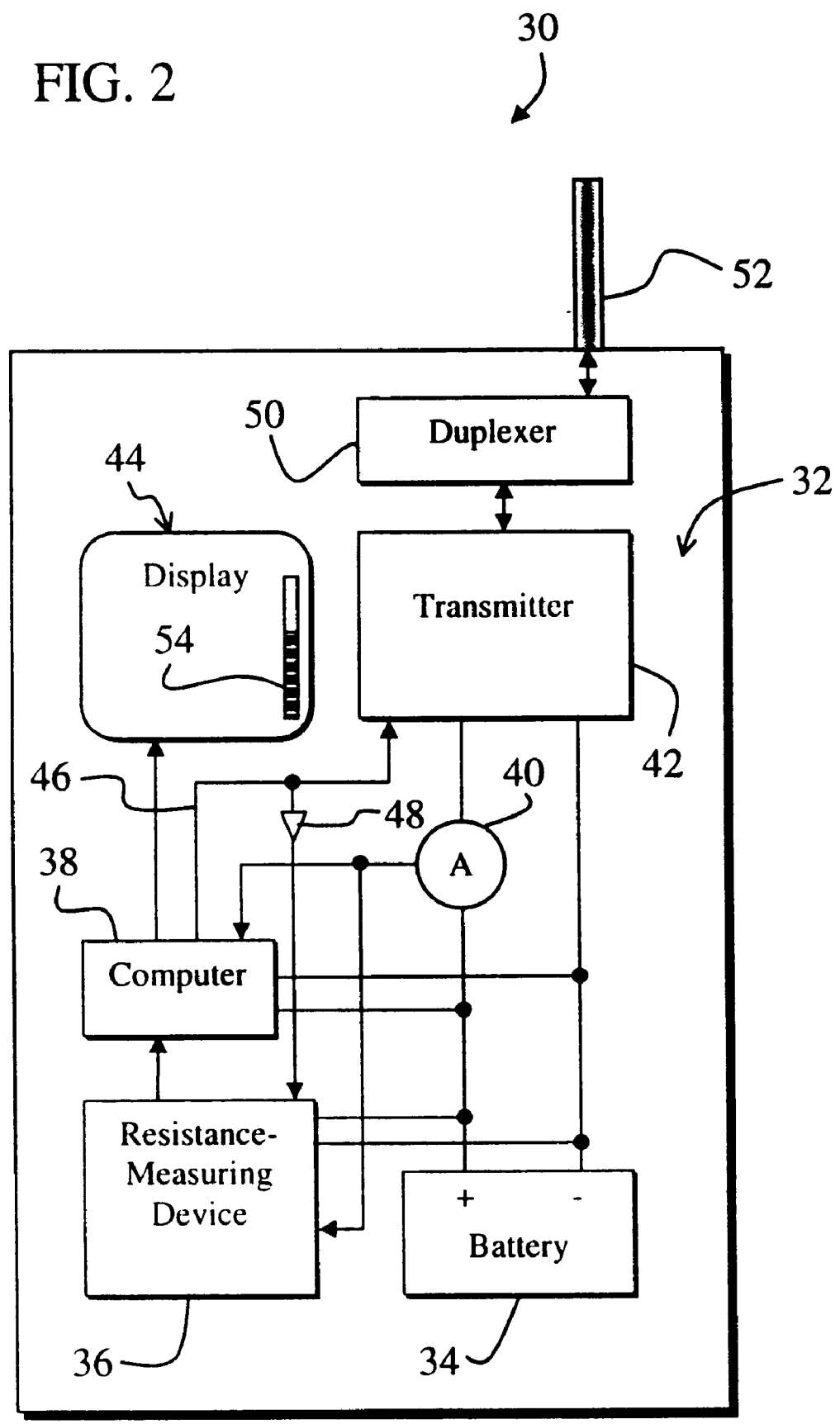
FIG. 2 is a diagram of a system for accurately indicating remaining battery life of the present invention adapted for use with a wireless phone and having a battery resistance-measuring device.

FIG. 2 is a diagram of a wireless phone 30 employing a system 32 of the present invention for accurately indicating remaining battery life. For clarity, various components such as the receiver, speakers, oscillators, encoders, amplifiers, filters, and so on, have been omitted from drawing of the phone 30 of FIG. 2. Those ordinarily skilled in the art will know where and how to implement the additional requisite components.

The system 32 includes a battery 34 having positive and negative terminals connected to a resistance-measuring device 36 and a computer 38. The negative terminal of the battery 34 is also connected to a transmitter 42. An ammeter 40 is connected between the positive terminal of the battery 34 and the transmitter 42 and measures current delivered from the battery 34 to the transmitter 42. An output of the ammeter 40 is connected, in parallel, to the computer 38 and the resistance-measuring device 36. An output of the computer 38 is connected to a display 44. A control line 46 is connected, in parallel, to the transmitter 42 and a delay circuit 48. An output of the delay circuit 48 is connected the resistance-measuring device 36. The transmitter 42 is connected to a duplexer 50 that is connected to an antenna 52.

In operation, the computer 38 stores various discharge curves associated with different current loads of the battery 34 and the internal resistance of the battery 34. The discharge curves may be empirically derived by one ordinarily skilled in the art for a particular battery and application.

The internal resistance of the battery 34 is provided to the computer 38 by the resistance-measuring device 36. The stored discharge curves may be visualized as a two-dimensional array of discharge curves, the array having a current axis and an internal resistance axis. In practice, the array maintains discharge curves for two or more current states and two or more internal battery resistance values. The discharge curves may be determined via empirical data associated with the battery 34. Alternatively, the computer 38 may run an algorithm, that is tailored to the battery 34, to calculate the discharge curves based on inputs from the ammeter 40 and the resistance-measuring device 36.

The computer 38 runs software, as discussed more fully below, to select or calculate a discharge curve associated with a given battery state as indicated by input from the ammeter 40 and the resistance-measuring device 36. Once a discharge curve is selected based on the internal resistance of the battery 34 and the current load on the battery 34, the software running on the computer 38 maps the discharge curve into a linear function (see FIG. 1) that varies over the expected life of the battery as determined based on the discharge curve. The value of the linear function associated with the present battery current load, internal resistance, and battery voltage is delivered from the computer 38 to the display 44, where it is displayed as an accurate indication of the relative remaining life of the battery 34. The battery voltage is provided by the battery 34 to the computer 38, which may include a voltmeter or other voltage sensing circuit or algorithm to measure the battery voltage. Alternatively, the present battery voltage may be provided to the computer 38 via a voltmeter included in the resistance-measuring device, as discussed more fully below.

The software running on the computer 38 also implements an algorithm to monitor when the internal resistance of the battery 34, as indicated by the resistance-measuring device 36, surpasses a predetermined threshold. Once the internal resistance of the battery 34 surpasses the predetermined threshold, a warning is displayed via the display 44 telling the user of the wireless phone 30 that the battery 34 is nearing the end of its life and will soon require replacement. The predetermined threshold is application-specific and may be easily determined by one of ordinary skill in the art to meet the needs of a given application.

The computer 38 periodically activates the transmitter 42, which acts as a switching load, via a control signal transferred over the control line 46 from the computer 38. In the present specific embodiment, when the control signal transitions from a low state to a high state, the transmitter 42 turns on and begins transmitting signals via the duplexer 50 and the antenna 52. The duplexer 50 facilitates the sharing of antenna resources between transmit functions implemented by the transmitter 42 and receive functions to implemented by a receiver (not shown).

When the transmitter 42 is activated and transmitting, peak current is drawn from the battery 34, which increases the battery discharge rate and shifts the voltage discharge curve of the battery 34. Shortly after (one delay as provided by the delay circuit 48) the transmitter 42 is activated, the resistance-measuring device 36 is activated via a delayed control signal output from delay circuit 48. The resistance-measuring device 36 stores the current reading ($I_{load}$) from the ammeter 40 and the voltage reading ($V_{load}$) from the battery 34. Those skilled in the art will appreciate that in some applications, the transmitter 42 (or other load) may have a fixed predetermined current draw, thus obviating the need to measure it.

When the control signal on the control line 46 transitions to a low state, the transmitter 42 turns off, and the resistance-measuring device 36 stores the current reading ($I_o$) from the ammeter 40 and the voltage reading ($V_o$) from the battery 34. The resistance-measuring device 36 then subtracts the most recently stored current reading $I_o$ from the previously stored current reading $I_{load}$ to yield a value ($\Delta I$) representing the change in current induced via the activation of the transmitter 42. The resistance-measuring device 36 also and subtracts the previously stored voltage reading $V_{load}$ from the last voltage reading $V_o$ to yield a value ($\Delta V$) representing the change in battery voltage inducted via the activation of the transmitter 42. The resistance-measuring device 36 then divides the change in voltage ($\Delta V$) by the change in current ($\Delta I$) to yield the internal resistance ($R_i$) of the battery 34 in accordance with the following equation:

$$R_i = \Delta V / \Delta I. \quad [1]$$

If approximately no current is drawn from the battery 34 when the transmitter 42 is not activated, then equation (1) reduces to:

$$R_i = \Delta V / I_{load}. \quad [2]$$

Software running on the computer 38 employs the internal resistance $R_i$ and the reading from the ammeter 40 to select a discharge curve most closely associated with the state of the battery 34 as characterized by the internal resistance $R_i$ and the current load $I_{load}$. The selected discharge curve is then employed, along with the present battery voltage, to display an accurate indication of relative remaining battery life 54.

Those skilled in the art will appreciate that the system 32 for providing an accurate indication of relative remaining battery life may be implemented in a device other than a wireless phone without departing from the scope of the present invention. For example, the transmitter 42 may be replaced by another switching load such as a variable resistor.

Figure 3:
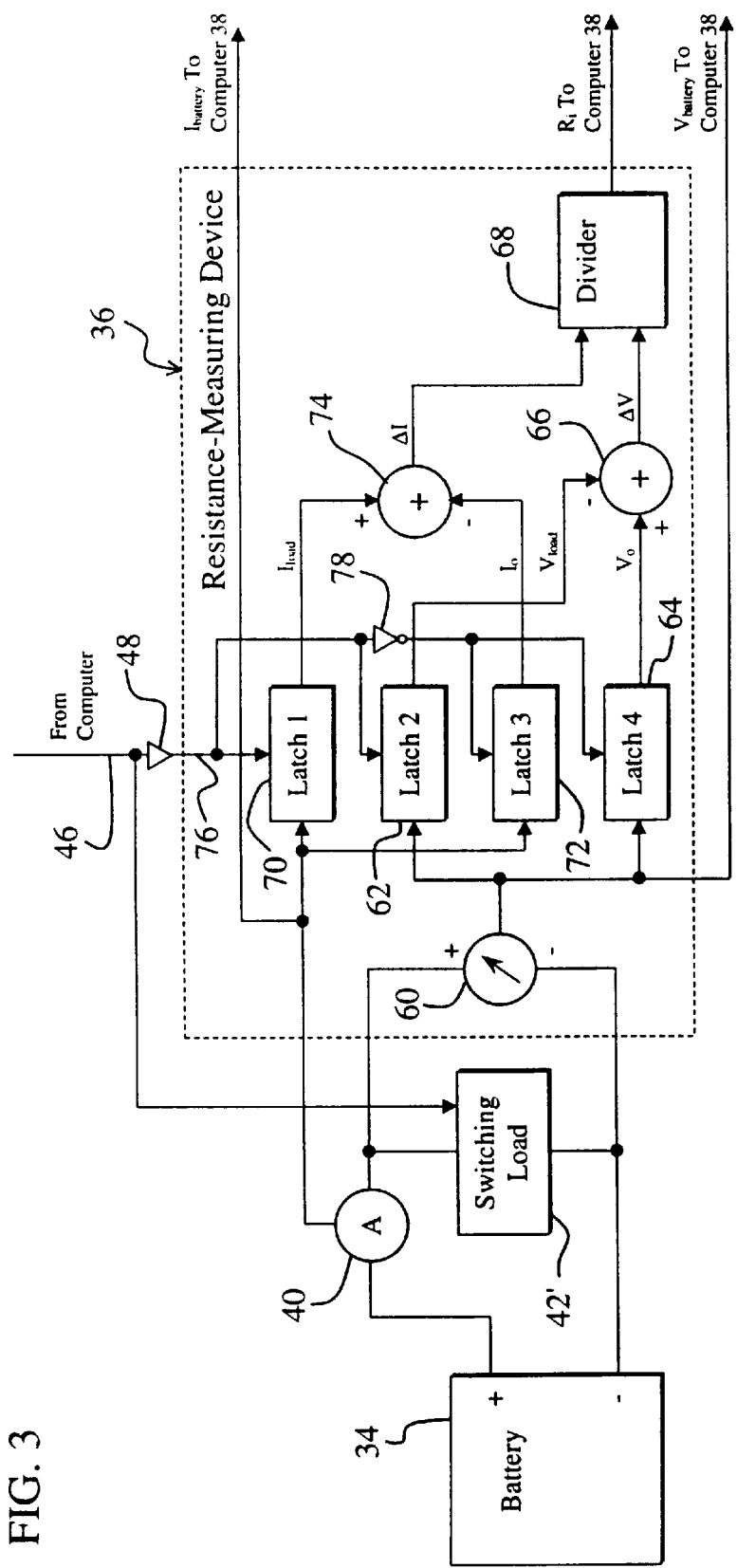
FIG. 3 is more detailed diagram showing the battery resistance-measuring device of FIG. 2.

FIG. 3 is more detailed diagram showing the battery resistance-measuring device 36 of FIG. 2. The transmitter 42 of FIG. 1 is replaced with a switching load 42' in FIG. 2. The switching load 42' may be a wireless phone display back-lighting mechanism or another mechanism on another device such as a switching load resistor.

The resistance-measuring device 36 includes a voltmeter 60 having a positive terminal connected to the positive terminal of the battery 34 via the ammeter 40. A negative terminal of the voltmeter 60 is connected to a negative terminal of the battery 34. An output of the voltmeter 60 is connected to a second latch 62, a fourth latch 64, and the computer 38 of FIG. 2. An output of the second latch 62 is connected to a positive terminal of a first subtractor 66. An output of the fourth latch 64 is connected to a negative terminal of the first subtractor 66, an output of which is connected to a divider 68. An output of the ammeter 40 is connected to the computer (see 38 of FIG. 1), a first latch 70, and a third latch 72. An output of the first latch 70 is connected to a positive terminal of a second subtractor 74. An output of the third latch 72 is connected to a negative terminal of the second subtractor 74, an output of which is also connected to the divider 68. An output of the divider 68 is connected to the computer 38 of FIG. 1. The control line 46 is connected to the switching load 42' and to an input of the first delay circuit 48. A delayed control signal 76 as output from the first delay circuit 48 is connected to a control input of the first latch 70, a control input of the second latch 62, and an input of an inverter 78. An output of the inverter 78 is connected to a control input of the third latch 72 and to a control input of the fourth latch 64. The latches 62, 64, 70, and 74 are rising edge triggered latches and may be easily constructed or ordered by those ordinarily skilled in the art.

When output of the inverter 78 transitions from a low state to a high state (rising edge), the delayed control signal 76 transitions from a high state to a low state (falling edge). As a result, the rising edge triggered latches 72 and 64 are only clocked, i.e., activated, after the delayed control signal 76 transitions from a high state to a low state causing the output of the inverter 78 to transition from a low state to a high state.

In operation, when the control signal activates the switching load 42' via the control line 46 by transitioning to a high state, the switching load pulls additional current from the battery 34. Once the switching load 42' is pulling additional current and after a delay introduced by the delay circuit 48, the current reading from the ammeter 40 is clocked into the first latch 70, and the voltage reading from the voltmeter 60 is clocked in the second latch 62 via the delayed control signal 76. The third latch 72 and the fourth latch 64 are not activated due to the inverter 78, and instead maintain their previously latched values, which represent the current load and the battery voltage, respectively, when the switching load 42' is off.

When the control line 46 transitions from a high state to a low state, the switching load 42' turns off and ceases to draw additional current from the battery 34. Subsequently, after a delay by the delay circuit 48, the current reading from the ammeter 40 and the current reading from the voltmeter 60 are latched into the third latch 72 and fourth latch 64, respectively, as the control output from the inverter 78 transitions from a high state to a low state.

The first subtractor 74 subtracts current measurement $I_o$ corresponding to the condition that the switching load 42' is not activated from the current measurement $I_{load}$ corresponding to the condition that the switching load 42' is activated, which are stored in the third latch 72 and the first latch 70, respectively. The second subtractor 74 then outputs a current difference $\Delta I$ in response thereto to the divider 68. Similarly, the first subtractor 66 subtracts the battery voltage $V_{load}$ when the switching load 42' is activated (high current case) from the battery voltage $V_o$ when the switching load 42' is not activated, which are stored in the second latch 62 and the fourth latch 64, respectively. The first subtractor 66 then outputs a voltage difference $\Delta V$ in response thereto to the divider 68. The divider 68 divides the voltage difference $\Delta V$ by the current difference $\Delta I$ and outputs a resistance value $R_i$ indicative of the internal resistance of the battery 34 to the computer 38 of FIG. 2 in response thereto.

With reference to FIGS. 2 and 3, software running on the computer 38 employs the internal resistance $R_i$ of the battery to select a group of discharge curves appropriate for a battery having the internal resistance $R_i$. In addition, the current load on the battery 34, as indicated by an output of the ammeter 40, which is connected to the computer 38, is employed to further select a discharge curve from the group of discharge curves that is appropriate for the given current load on the battery 34. When the internal resistance of the battery 34 exceeds a predetermined threshold, the computer displays a warning to the user via the display 44 indicating that the battery should be replaced soon.

Those skilled in the art will appreciate that the resistance-measuring device 36 may be omitted without departing from the scope of the present invention. In this case, software running on the computer 38 measures the current load on the battery 34 as indicated by output from the ammeter 40 to select an appropriate discharge curve. Similarly, the output from the ammeter 40 that is connected to the computer 38 may be omitted while retaining the resistance-measuring device 36, without departing from the scope of the present invention. In this case, the software running on the computer 38 selects an appropriate discharge curve based primarily on the internal resistance $R_i$ of the battery 34.

FIG. 4 is a flow diagram of the method 90 for determining the remaining life of the battery 34 of the system 32 of FIG. 2 and as implemented via software running on the computer 38 of FIG. 2. The method 90 may be easily implemented in software by those ordinarily skilled in the art. Alternatively, the method 90 may be implemented in hardware by those ordinarily skilled in the art.

Initially, in a discharge curve step 92, discharge curves associated with the particular battery 34 of FIG. 2 are determined for varying current loads and varying internal resistance. The discharge curves are stored in memory and indexed by current load and internal resistance. The number of stored discharge curves is application-specific and in the present specific embodiment is nine discharge curves.

With reference to FIGS. 2 and 4, subsequently, in a curve-selection step 94, the software activates the control signal 46 of FIG. 2 and receives the current load on the battery as output from the ammeter 40 and the internal resistance of the battery 34 as measured by the resistance-measuring device 36. In the curve selection step 94, the software selects a discharge curve based on the battery resistance and the current load that most closely match the index of the discharge curve. Those skilled in the art will appreciate that the exact method for selecting the discharge curve based on the current and internal resistance is application-specific and may require rounding up or rounding down of the current load values and/or the battery resistance values to the nearest index value. Those ordinarily skilled in the art will know how to implement the selection process to meet the needs of a given application.

Subsequently, in a threshold step 96, the software checks if the internal resistance of the battery 34 exceeds a threshold beyond which the battery 34 is likely to fail. If the internal resistance exceeds the threshold, control is passed to a warning step 98, where a warning is displayed suggesting to the user that the battery 34 be replaced. Control is then passed to an indication step 100. If the internal resistance of the battery 34 does not exceed the threshold then control is passed directly to the indication step 100.

In the indication step 100, the software computes a value such as a percentage of remaining battery life based on the selected discharge curve and the present battery voltage. In the present specific embodiment, the value is based on a linear function of time that is based on the discharge curve, however, another type of function may be appropriate for another application and may be employed without departing from the scope of the present invention. Subsequently, control is passed to a display step 102, where the computed value is displayed as an accurate indication of the relative remaining life of the battery 34.

Those skilled in the art will appreciate that the discharge curve step 92, the curve selection step 94, and the indication step 100 may be replaced by a step that calculates the indication of remaining battery life directly based on the internal resistance of the battery 34, the present battery voltage, and/or the current load on the battery 34. In addition, the threshold step 96 and the warning step 98 may be omitted without departing from the scope of the present invention.

Thus, the present invention has been described herein with reference to a particular embodiment for a particular application. Those having ordinary skill in the art and access to the present teachings will recognize additional modifications, applications and embodiments within the scope thereof.

It is therefore intended by the appended claims to cover any and all such applications, modifications and embodiments within the scope of the present invention.

What is claimed is:

1. A system for providing an accurate indication of the relative remaining life of a battery comprising:

first means for providing a control signal;

second means for altering a discharge rate of said battery from a first discharge rate to a second discharge rate in response to said control signal;

third means for measuring a first voltage of said battery when said battery is characterized by said first discharge rate and a second voltage of said battery when said battery is characterized by said second discharge rate;

fourth means for determining an operational state of said battery based on said first voltage, said second voltage, said first discharge rate, and said second discharge rate; and fifth means for providing an indication of remaining battery life in response to said operational state.

2. The system of claim 1 wherein said second means includes a switching load for drawing a first amount of current from said battery corresponding to said first discharge rate and for drawing a second amount of current from said battery corresponding to said second discharge rate.

3. The system of claim 2 wherein said first discharge rate is approximately zero.

4. The system of claim 3 wherein said second discharge rate is relatively high discharge rate.

5. The system of claim 4 wherein said switching load is a transmitter.

6. The system of claim 5 wherein said transmitter is a wireless phone transmitter.

7. A system for providing an accurate indication of the relative remaining life of a battery comprising:

a computer, said computer providing a control signal;

a switching load connected to said battery for altering a discharge rate of said battery from a first discharge rate to a second discharge rate in response to said control signal;

a voltage meter for measuring a first voltage of said battery when said battery is characterized by said first discharge rate and a second voltage of said battery when said battery is characterized by said second discharge rate;

a circuit for determining an operational state of said battery based on said first voltage, said second voltage, said first discharge rate, and said second discharge rate; and software running on said computer for providing an indication of remaining battery life in response to said operational state.

8. A method for providing an accurate indication of the relative remaining life of a battery comprising:

providing a control signal;

altering a discharge rate of said battery from a first discharge rate to a second discharge rate in response to said control signal;

measuring a first voltage of said battery when said battery is characterized by said first discharge rate and a second voltage of said battery when said battery is characterized by said second discharge rate;

determining an operational state of said battery based on said first voltage, said second voltage, said first discharge rate, and said second discharge rate; and providing an indication of remaining battery life in response to said operational state.

9. The method of claim 8 wherein the step of altering a discharge rate comprises controlling a switching load connected to said battery for drawing a first amount of current from said battery corresponding to said first discharge rate and for drawing a second amount of current from said battery corresponding to said second discharge rate.

10. The method of claim 9 wherein said first discharge rate is approximately zero.

11. The method of claim 10 wherein said second discharge rate is relatively high discharge rate.

12. The method of claim 11 wherein said switching load is a transmitter.

13. The method of claim 12 wherein said transmitter is a wireless phone transmitter.

* * * * *